United States Patent
Suzuki et al.

(10) Patent No.: US 7,192,326 B2
(45) Date of Patent: Mar. 20, 2007

(54) METHOD OF MANUFACTURING A LIGHT-EMITTING ELEMENT USING A RUBBING TREATMENT

(75) Inventors: Tsunenori Suzuki, Kanagawa (JP);
Ryoji Nomura, Kanagawa (JP); Satoshi Seo, Kanagawa (JP)

(73) Assignee: Semiconductor Energy Laboratory Co., Ltd., Atsugi ( * ) Notice: Subject to any disclaimer, the term of this patent is extended or adjusted under 35 U.S.C. 154(b) by 0 days.

(21) Appl. No.: 10/919,467

(22) Filed: Aug. 17, 2004

(65) Prior Publication Data

US 2005/0052123 A1   Mar. 10, 2005

(30) Foreign Application Priority Data

Aug. 29, 2003   (JP)   ............................. 2003-305915

(51) Int. Cl.
*H01J 9/00* (2006.01)
(52) U.S. Cl. .......................................... 445/24; 313/504
(58) Field of Classification Search ............ 445/23–25; 427/11, 242; 401/49, 19
See application file for complete search history.

(56) References Cited

U.S. PATENT DOCUMENTS

| 4,356,429 A | * | 10/1982 | Tang ............................ 313/503 |
| 4,534,743 A | * | 8/1985 | D'Onofrio et al. ............. 445/24 |
| 5,048,933 A | * | 9/1991 | Asano ......................... 349/61 |
| 5,748,271 A | * | 5/1998 | Hikmet et al. ................ 349/69 |
| 5,929,561 A | | 7/1999 | Kawami et al. |
| 5,999,241 A | | 12/1999 | Nishi et al. |
| 6,275,277 B1 | * | 8/2001 | Walker et al. ............... 349/113 |
| 2002/0051112 A1 | | 5/2002 | Katsura |
| 2002/0061418 A1 | | 5/2002 | Imanishi |
| 2002/0110940 A1 | | 8/2002 | Yamagata et al. |
| 2002/0113248 A1 | | 8/2002 | Yamagata et al. |
| 2003/0201443 A1 | | 10/2003 | Yamagata et al. |

FOREIGN PATENT DOCUMENTS

| JP | 09-245965 | 9/1997 |
| JP | 2002-110363 | 4/2002 |

OTHER PUBLICATIONS

Masanao Era et al.; "Polarized electroluminescence from oriented p-sexiphenyl vacuum-deposited film"; *Applied Physics Letters* 67(17); pp. 2436-2438; 1995.

* cited by examiner

*Primary Examiner*—Karabi Guharay
*Assistant Examiner*—Dalei Dong
(74) *Attorney, Agent, or Firm*—Fish & Richardson P.C.

(57) ABSTRACT

The present invention provides a method for manufacturing a light-emitting element that can be driven with low voltage or utilizes current more efficiently without damaging an organic compound, and a light-emitting element formed by the method. According to the present invention, a rubbing treatment is performed on a surface of an electrode on which an organic layer is formed so as to control a molecular arrangement of an organic compound included in the organic layer. A second electrode is formed over the organic compound.

48 Claims, 7 Drawing Sheets

METHOD OF MANUFACTURING A LIGHT-EMITTING ELEMENT USING A RUBBING TREATMENT

BACKGROUND OF THE INVENTION

1. Field of the Invention

The present invention relates to a method for manufacturing a light-emitting element in which a layer comprising an organic compound is sandwiched between a pair of electrodes, and a light-emitting element formed by the method for manufacturing.

2. Description of the Related Art

A light-emitting element typified by an organic electroluminescent (EL) element has a typical structure in which a layer comprising an organic compound is sandwiched between a pair of electrodes, and it is an element which emits light by applying voltage to the both electrodes. In the light-emission mechanism, when the voltage is applied to the electrodes, a hole from an anode and an electron from a cathode are injected into the layer comprising an organic compound and moved. It is said that the hole and the electron cause a recombination with a certain probability and a singlet exciton of the organic compound is generated to emit light. Light-emission of an organic electroluminescent element can pass through an anode and a substrate to be emitted outside by using a transparent electrode as the anode.

Various studies for improving the luminous efficiency of an organic EL element has been made for the sake of utilizing an organic EL element as a display element of a display unit. It is one of important objects to increase the light-extraction efficiency (a coefficient of taking out light-emission in the interior of an element) in order to increase the luminous efficiency.

The light-extraction efficiency is a value that is obtained by considering the total reflection in an organic layer, on an electrode interface or the like with respect to light emission from the inside of the organic layer, but it is thought that the limit to the light-extraction efficiency is about 20 percents in view of a refractive index of the organic layer.

It is described in Reference 1 (Japanese Patent Laid-Open No. 2002-110363) that a direction of light-emission from an organic compound included in a light emitting layer is turned to an electrode direction (light-emission from an organic compound is controlled by a molecular arrangement), which is effective for preventing a loss of light-emission by the light-extraction efficiency.

However, there is a risk that an organic compound is damaged since a rubbing treatment is performed on a surface of an organic layer formed over a substrate, according to the method described in Reference 1.

SUMMARY OF THE INVENTION

It is an object of the present invention to provide a method for manufacturing a light-emitting element that can be driven with low voltage or to utilizes current more efficiently without damaging an organic compound, and a light-emitting element formed by the method for manufacturing.

According to the present invention, a rubbing treatment is performed on a surface of an electrode on which an organic layer is formed so as to control a molecular arrangement of an organic compound included in the organic layer. It is possible to turn the direction of light-emission from the organic compound to the electrode by performing the rubbing treatment on the surface of the electrode, and thus, to improve a current efficiency and further to realize the improvement in the light-extraction efficiency. In the present invention, specifically, a conductive film including a crystal component, such as a metal oxide typified by an indium tin oxide (ITO) is used as an electrode on which an organic layer is formed.

Here, the rubbing treatment is a treatment for orienting a molecule of an organic compound included in an organic layer formed on an electrode on which the rubbing treatment is performed, in a certain direction. In order to orient the molecule of the organic compound, minute unevenness is formed in a certain direction on a surface of the electrode by rubbing the surface of the electrode with a cloth for the rubbing treatment.

In addition, a dichroic ratio of polarized light photoluminescence (PL) intensity (photon number) of a light-emitting element is changed by ten percents or more, and an orientation angle is changed in the range of from 2° through 90° by the above rubbing treatment.

The orientation angle is an angle between a normal vector of a substrate and a transition dipole moment of the molecule of the organic compound included in the organic layer.

According to the above described structure of the present invention, it is possible to control a molecular arrangement of an organic compound and to turn the direction of light-emission from the organic compound to an electrode, without performing a rubbing treatment on a surface of an organic layer. Therefore, enhancement of the light-extraction efficiency can be realized without damaging an organic compound, and consequently, a low drive voltage or improvement in high-efficiency of current of a light-emitting element can be realized. Lower drive voltage of a light-emitting device itself can be realized by using the above described light-emitting element as a display element of the light-emitting device.

These and other objects, features and advantages of the present invention become more apparent upon reading of the following detailed description along with the accompanying drawings.

DETAILED DESCRIPTION OF THE INVENTION

[Embodiment Mode]

Figure 1A:
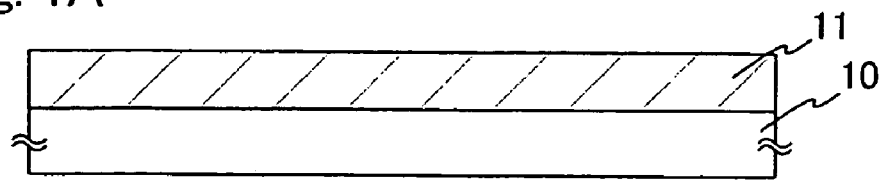
FIGS. 1A to 1C show a method for manufacturing a light-emitting element of the present invention.

As shown in FIG. 1A, an indium tin oxide (ITO) is first formed on a substrate 10 to form an anode 11. Note that the anode 11 may comprise a metal, an alloy, an electrical conductive compound having a large work function (4.0 eV or more), and a mixture of them, in addition to an ITO. For example, a metal oxide such as IZO (indium zinc oxide) in which 2 to 20 percent zinc oxide (ZnO) is mixed into indium oxide is preferable, but gold (Au), platinum (Pt), nickel (Ni), tungsten (W), chrome (Cr), molybdenum (Mo), iron (Fe), cobalt (Co), copper (Cu), palladium (Pd), a nitride of a metal material (such as TiN) or the like may be used.

Note that the metal oxide may be one which mainly contains an amorphous component in film formation and then, is crystallized by a heat treatment, or one in which mainly contains a crystalline component since film formation by a heat treatment for forming a film.

Figure 1B:
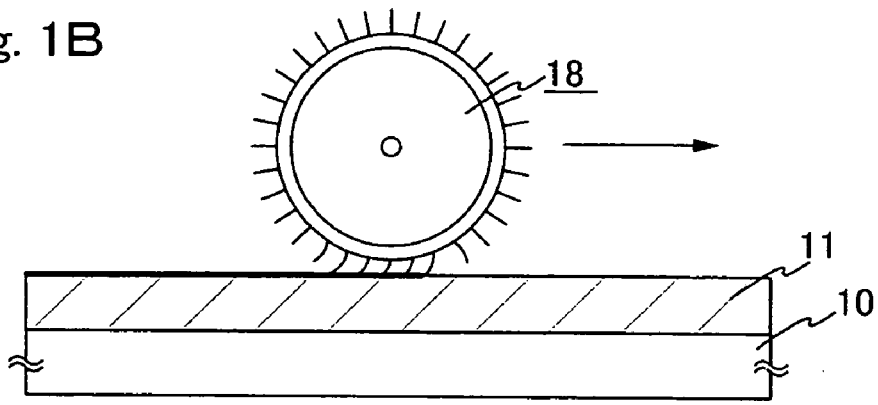

Then, as shown in FIG. 1B, a treatment for rubbing a surface of the anode 11 with a rubbing cloth (rubbing treatment) is conducted. For example, cellulosic fiber such as rayon (a registered trademark) can be employed as the cloth. In addition, the rubbing treatment can be performed by a method of rotating a roller 18 wrapped with the cloth, in certain direction.

Next, ultrasonic cleaning is performed on the surface of the anode 11 after the rubbing treatment. After the cleaning, the substrate 10 is heated.

Note that a rubbing-treated ITO may be element-separated by patterning or a barrier layer may be provided.

Figure 1C:
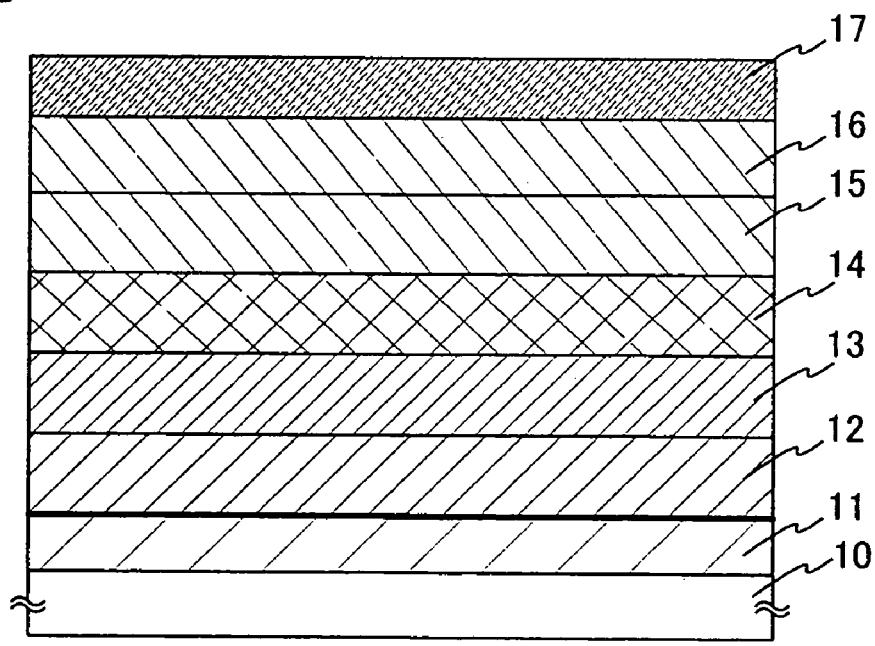

As shown in FIG. 1C, an organic layer is formed over the anode 11. Herein, an example of employing a hole injecting layer 12, a hole transporting layer 13, a light-emitting layer 14, an electron transporting layer 15, an electron injecting layer 16 as the organic layer is described. The hole injecting layer 12 is first formed over the anode 11. The hole injecting layer 12 is formed, for example, by a vapor deposition of a phthalocyanine compound such as phthalocyanine ($H_2Pc$) or copper phthalocyanine (CuPc).

Then, the hole transporting layer 13 is formed on the hole injecting layer 12. the hole transporting layer 13 can be formed by a vapor deposition of an aromatic amine-based (that is, a compound having a benzene ring-nitrogen bond) compound. As the aromatic amine-based compound, in addition to 4,4'-bis[N-(3-methylphenyl)-N-phenyl-amino]-biphenyl (TPD), a derivative thereof such as 4, 4'-bis[N-(1-naphthyl)-N-phenyl-amino]-biphenyl ("α-NPD") is cited. Further, star burst aromatic amine compounds such as 4, 4', 4"-tris (N,N-diphenyl-amino)-triphenyl amine (TDATA), and 4, 4', 4"-tris [N-(3-methylphenyl)-N-phenyl-amino]-triphenyl amine (MTDATA) are also cited.

Then, the light-emitting layer 14 is formed on the hole transporting layer 13. The light-emitting layer 14 is formed, for example, by a vapor deposition of a light-emitting material having a favorable light-emitting capability and a carrier transporting property such as 9,10-di(2-naphthyl) anthracene (DNA), or tris (8-quinolinolato) aluminum ($Alq_3$). Note that a material obtained by a co-evaporation of a material having a favorable carrier transporting property such as DNA or $Alq_3$ and a guest material can be also used for the light-emitting layer 14. As the guest material, a phosphorescent material such as bis (2-(2'-benzothienyl) pyridinato-N,$C^{3'}$)(acetylacetonato)iridium ($Ir(btp)_2(acac)$) can be also used, in addition to a fluorescent material such as N,N'-dimethyl quinacridon (DMQd), 4-(dicyanomethylene)-2-methyl-6-(p-dimethylaminostyryl)-4H-pyran (DCM1), 4-(dicyanomethylene)-2-methyl-6-(julolidine-4-yl-vinyl)-4H-pyran (DCM2), N,N-dimethyl quinacridon (DMQd), 9,10-diphenylanthracene (DPA), 5,12-diphenyl tetracene (DPT), coumarin 6, perylene, or rubrene.

The electron transporting layer 15 is formed on the light-emitting layer 14. As the electron transporting layer 15, metal complexes having a quinoline skeleton or benzoquinoline skeleton such as tris(8-quinolinolate) aluminum ($Alq_3$), tris (5-methyl-8-quinolinolate) aluminium ($Almq_3$), bis(10-hydroxybenzo[h]-quinolinato) beryllium ($BeBq_2$), bis(2-methyl-8-quinolinolate)-4-phenyl phenolate-aluminium (BAlq) can be used. Other examples include metal complexes having oxazole-based and thiazole-based ligands such as bis[2-(2-hydroxyphenyl)-benzoxazorato]zinc ($Zn(BOX)_2$) and bis[2-(2-hydroxyphenyl)-benzothiazorato] zinc ($Zn(BTZ)_2$). Further, 2-(4-biphenyl)-5-(4-tert-butylphenyl)-1,3,4-oxadiazole (PBD), and 1,3-bis [5-(p-tert-butylphenyl)-1,3,4-oxadiazole-2-yl]benzene (OXD-7); 3-(4-tert-butylphenyl)-4-phenyl-5-(4-biphenylyl)-1, 2, 4-triazole (TAZ) and 3-(4-tert-butylphenyl)-4-(4-ethylphenyl)-5-(4-biphenylyl)-1, 2, 4-triazole (p-EtTAZ); bathophenanthroline (BPhen); bathocuproin (BCP) and the like can be used, in addition to metal complexes.

Then, the electron injecting layer 16 is formed on the electron transporting layer 15. For the electron injecting layer 16, a compound of an alkali metal or an alkaline-earth metal such as lithium fluoride (LiF), cesium fluoride (CsF), calcium fluoride ($CaF_2$) can be used. Alternatively, a material having electron transporting property, which contains an alkali metal or an alkaline-earth metal, for example, an material in which magnesium (Mg) is contained in Alq, or the like can be used.

After the organic layer is formed, a cathode 17 is formed. Concretely, the cathode 17 is formed on the electron injecting layer 16 in FIG. 1C. A metal, an alloy, an electrical conductive compound having a small work function (work function of 3.8 eV or less) or a mixture of them is preferably used for the cathode 17. As a concrete example of such cathode materials, elements belonging to 1 group or 2 group in the element periodic table, namely alkali metals such as lithium (Li) and cesium (Cs), alkaline-earth metals such as magnesium (Mg), calcium (Ca), and strontium (Sr), and alloys including them (Mg:Ag, Al:Li) are given. However, a layer made of a compound of an alkali metal or an alkali-earth metal, such as lithium fluoride (LiF), cesium fluoride (CsF), or calcium fluoride ($CaF_2$) is provided between the electrode 17 and the light-emitting layer 14 to be laminated with the cathode 17. As a result, various electrical conductive materials such as Al, Ag, and ITO can be used for the cathode 17 regardless of a work function.

Note that the hole injecting layer 12, the hole transporting layer 13, the light-emitting layer 14, the electron transporting layer 15, and the electron injecting layer 16 may be formed by either ink-jetting or spin coating, in addition to by a vapor deposition. In addition, the layers may be formed by using a material other than the material described above.

A structure of the light-emitting element is not limited to the above described structure, even a light-emitting element having a laminated structure between the anode 11 and the cathode 17, which is different from the above described structure, may be employed. For example, a structure in which a hole blocking layer is provided between the light-emitting layer and the electron transporting layer, may be employed. Further, layers such as an electron injecting layer, an electron transporting layer, a hole blocking layer, a hole transporting layer, and a hole injecting layer are combined freely and provided, in addition to a light-emitting layer. A light-emitting element comprising a laminated structure such as a lamination of a hole injecting layer, a light emitting layer, an electron transporting layer in this order; a lamination of a hole injecting layer, a hole transporting layer, a light-emitting layer, a hole blocking layer, an electron transporting layer, an electron injecting layer in this order; a lamination of a hole injecting layer, a hole transporting layer, a light-emitting layer, a hole blocking layer, an electron transporting layer in this order; a lamination of a hole injecting layer, a hole transporting layer, a light-emitting layer, an electron transporting layer, an electron injecting layer in this order; or a lamination of a hole injecting layer, a hole transporting layer, a light-emitting layer, an electron transporting layer in this order, between the anode 11 and the cathode 17 may be employed. Note that BAlq, OXD-7, TAZ, p-EtTAZ, BPhen, BCP or the like can be used for a material of the hole blocking layer.

Figure 2:
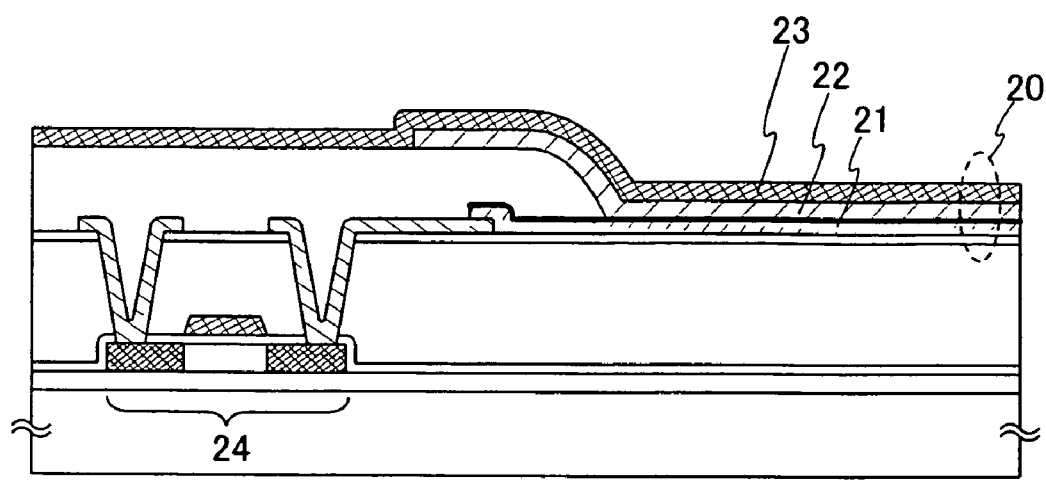
FIG. 2 is a cross-sectional view of a light-emitting element of the present invention.

In this embodiment mode, the light-emitting element is manufactured over the substrate 10 made of glass, plastic or the like. A passive type light-emitting device can be manufactured by forming plural light-emitting elements like this over one substrate. In addition, the light-emitting element may be formed over a thin film transistor (TFT) array substrate, for example, as shown in FIG. 2, besides a substrate made of glass, plastic, or the like. In FIG. 2, a light-emitting element 20 comprising an anode 21 whose surface is exposed to a rubbing treatment, a cathode 23, and an organic layer 22 provided between the anode 21 and the cathode 23 is formed over a substrate over which a TFT 24 is formed, like a passive type light-emitting device. And the anode 21 is connected to a drain of the TFT 24 electrically. An active matrix type light-emitting device which controls driving of a light-emitting element with a TFT can be manufactured by using the light-emitting element of the present invention as shown in FIG. 2. Note that a structure of the TFT may be bottom gate type without being limited to a top gate type as shown in FIG. 2.

As described above, a treatment for forming a groove or a minute univenness to control a molecular arrangement of an organic compound, specifically, a rubbing treatment, is performed on a surface of an electrode over which an organic layer is formed, so as to lower a drive voltage of a light-emitting element. Alternatively, current efficiency of the light-emitting element can be increased.

[Embodiment 1]

This embodiment describes a method for manufacturing a light-emitting element of the present invention and properties of the light-emitting element.

A method for manufacturing a light-emitting element of the present invention is described first.

An ITO (indium tin oxide) is formed by sputtering as a transparent electrode over a glass substrate 100 to form an anode 101. Note that the ITO in the film formation contains an amorphous component as the main component.

After the ITO is etched to be element-separated, it is heated at 200° C. for one hour. A bank is formed by applying a positive type acryl and then exposing it to light-exposure and development. After that, it is heated at 220° C. for one hour.

Then, the surface of the anode 101 is rubbed in certain direction with a roller of a rubbing device, which is wrapped with a rayon cloth (rubbing treatment). Note that the treatment is performed under such conditions that the press force is 0.4 mm, the number of roller rotations is 300 rpm, the speed for transporting a substrate is 10 mm/sec, and a substrate is transported one time.

After the rubbing treatment, ultrasonic cleaning is performed on the surface of the anode 101, and further it is heated at 205° C. for one hour.

Figure 3A:
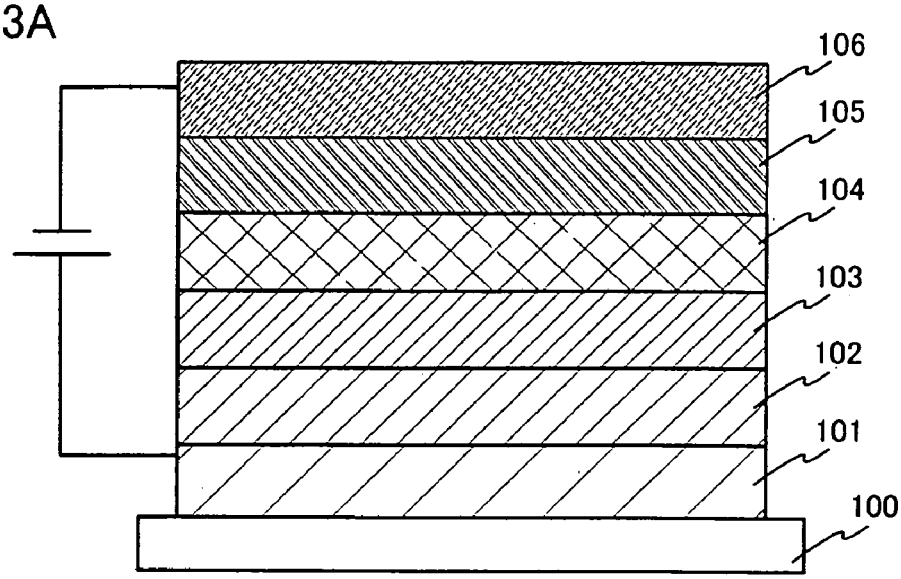
FIGS. 3A to 3C are cross-sectional views of light-emitting elements of the present invention.

Then, copper phthalocyanine for a hole injecting layer 102, α-NPD for a hole transporting layer 103, Alq$_3$ for a light-emitting layer 104, CaF$_2$ for an electron injecting layer 105, and aluminum for a cathode 106 are sequentially formed over the anode 101 to manufacture a light-emitting element 1 (FIG. 3A). Regarding the film thickness of each layer, the hole injecting layer 102 is 20 nm thick, the hole transporting layer 103 is 40 nm thick, the light-emitting layer 104 is 50 nm thick, and the electron injecting layer 105 is 2 nm thick. The film formation is performed by a vacuum vapor deposition.

In addition, in order to compare with the light-emitting element 1, another light-emitting element having the same laminated structure as the light-emitting element 1, but without the rubbing treatment on a surface of an anode, is manufactured. It is compared with the light-emitting element 1.

Figure 4A:
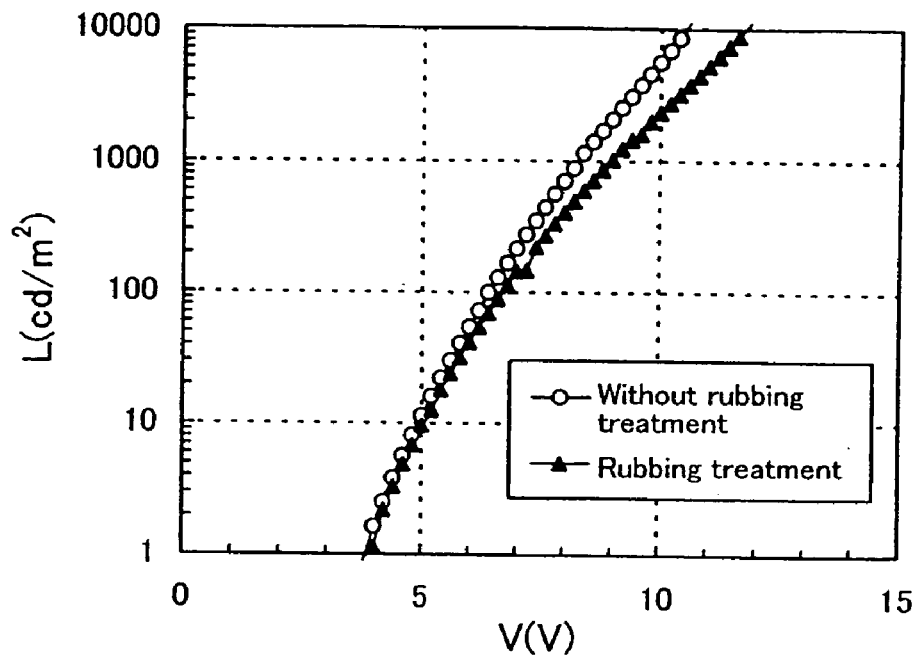
FIGS. 4A and 4B are a graph showing a measurement value of luminance to voltage and a graph showing a measurement value of current efficiency to luminance, respectively.
Figure 4B:
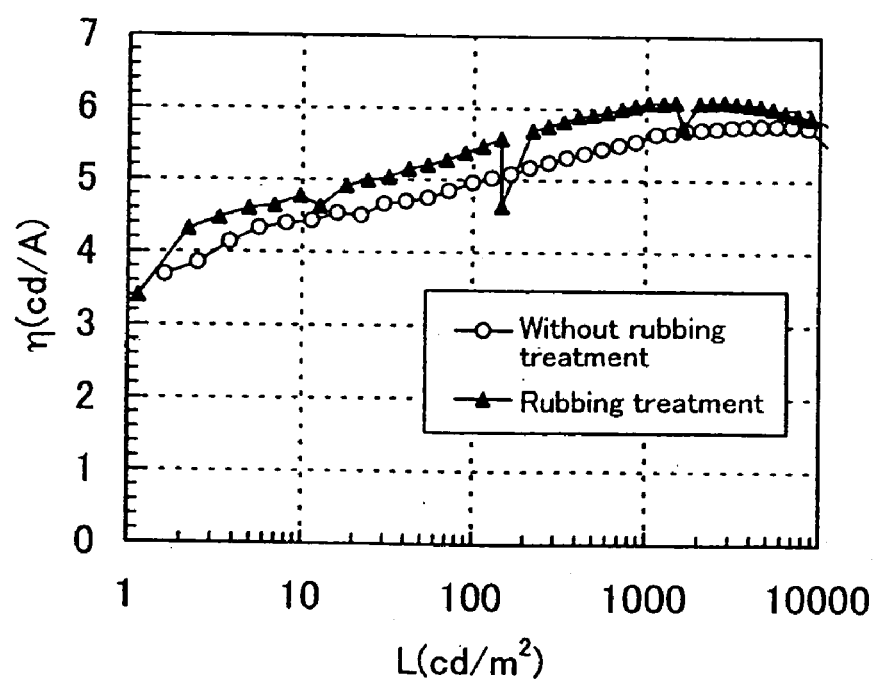

FIG. 4A shows a graph of measurement values of luminance L (cd/m$^2$) to voltage V of the light-emitting element 1 with the rubbing treatment and the light-emitting element without the rubbing treatment. FIG. 4B shows a graph of measurement values of current efficiency η (cd/A) to luminance L (cd/m$^2$) of the light-emitting element 1 with the rubbing treatment and the light-emitting element without the rubbing treatment.

As shown in FIGS. 4A and 4B, the voltage for light-emission of lcd/m$^2$ is 4.0 V and the current efficiency is 5.4 cd/A in light-emission of 100 cd/m$^2$ in the light-emitting element 1 with the rubbing treatment.

On the other hand, as shown in FIGS. 4A and 4B, the voltage for light-emission of 1 cd/m$^2$ is 4.0 V and the current efficiency is 5.03 cd/A in light-emission of 100 cd/m$^2$ in the light-emitting element without the rubbing treatment.

Therefore, it is understood that the current efficiency in light-emission of 100 cd/m$^2$ is higher in the light-emitting element 1 with the rubbing treatment than in the light-emitting element without the rubbing treatment.

[Embodiment 2]

A light-emitting element of the present invention having a different laminted structure from that of Embodiment 1 is described. Note that from the rubbing treatment to a step of heating is similar to that of Embodiment 1, and thus, the description about it is omitted here.

Figure 3B:
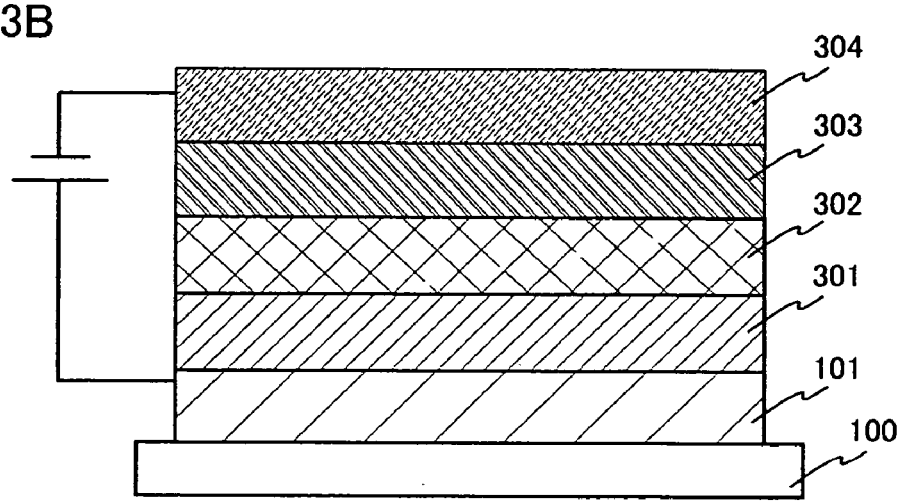

After the heat treatment of 205° C., α-NPD for a hole transporting layer 301, Alq$_3$ for a light-emitting layer 302, CaF$_2$ for an electron injecting layer 303, and aluminum for a cathode 304 are sequentially formed over an anode 101 to manufacuture a light-emitting element 2 (FIG. 3B). Regarding the film thickness of each layer, the hole transporting layer 301 is 40 nm thick, the light-emitting layer 302 is 50 nm thick, and the electron injecting layer 303 is 2 nm thick. The film formation is performed by a vacuum vapor deposition.

In addition, in order to compare with the light-emitting element 2, another light-emitting element that has the same laminated structure as the light-emitting element 2, but that is not exposed to the rubbing treatment, is manufactured. It is compared with the light-emitting element 2.

Figure 5A:
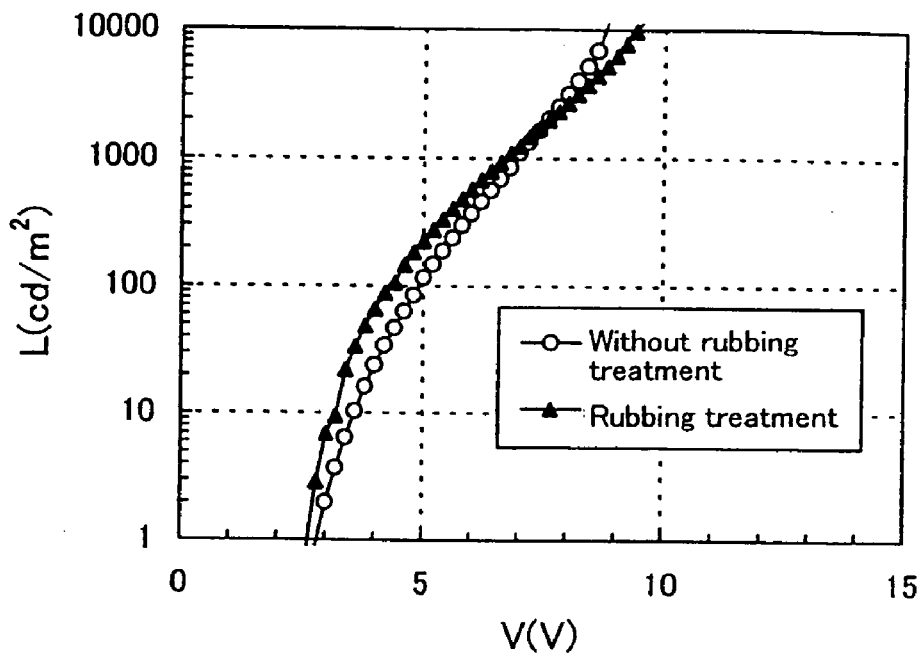
FIGS. 5A and 5B are a graph showing a measurement value of luminance to voltage and a graph showing a measurement value of current efficiency to luminance, respectively.
Figure 5B:
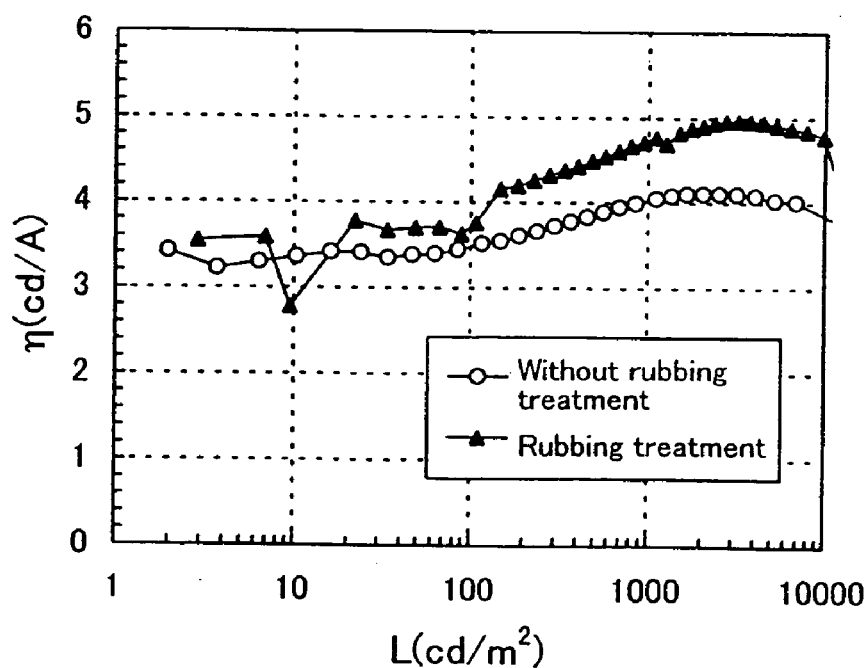

FIG. 5A shows a graph of measurement values of luminance L (cd/m$^2$) to voltage V of the light-emitting element 2 with the rubbing treatment and the light-emitting element without the rubbing treatment. FIG. 5B shows a graph of measurement values of current efficiency η (cd/A) to luminance L (cd/m$^2$) of the light-emitting element 2 with the rubbing treatment and the light-emitting element without the rubbing treatment.

As shown in FIGS. 5A and 5B, the voltage for light-emission of 1 cd/m$^2$ is 2.8 V and the current efficiency is 3.7 cd/A in light-emission of 100 cd/m² in the light-emitting element 2 with the rubbing treatment.

On the other hand, as shown in FIGS. 5A and 5B, the voltage for light-emission of 1 cd/m² is 3.0 V and the current efficiency is 3.5 cd/A in light-emission of 100 cd/m² in the light-emitting element without the rubbing treatment.

Therefore, it is understood that the voltage for light-emission of 1 cd/m² is lower and the current efficiency in light-emission of 100 cd/m² is higher in the light-emitting element 2 with the rubbing treatment than in the light-emitting element without the rubbing treatment.

[Embodiment 3]

A light-emitting element of the present invention having a different laminated structure from that of Embodiment 1 is described. Note that from the rubbing treatment to a step of heating is similar to that of Embodiment 1, and thus, the description about it is omitted here.

Figure 3C:
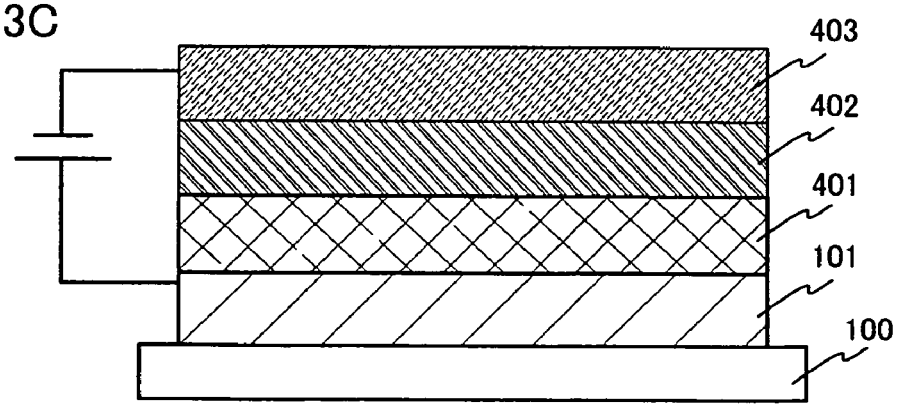

After the heat treatment of 205° C., $Alq_3$ for a light-emitting layer 401, $CaF_2$ for an electron injecting layer 402, and aluminum for a cathode 403 are sequentially formed over an anode 101 to manufacture a light-emitting element 3 (FIG. 3C). Regarding the film thickness of each layer, the light-emitting layer 401 is 90 nm thick, and the electron injecting layer 402 is 2 nm thick. The film formation is performed by a vacuum vapor deposition.

In addition, in order to compare with the light-emitting element 3, another light-emitting element having the same laminated structure as the light-emitting element 3, but without the rubbing treatment, is manufactured. It is compared with the light-emitting element 3.

Note that when a molecule over the substrate is orientated at a certain angle γ, the ratio of P polarized light and S polarized light (dichroic ratio) that are absorption spectrums of the molecule and the orientation angle γ are expressed by the following equation 1, based on a hypothesis that the molecule is arranged in the uniaxial orientation. An absorption spectrum and a light-emission spectrum can be determined uniquely, in the case where it is considered that the molecule can absorb only light in a transient moment direction and emit light in the transient moment direction. In other words, the dichroic ratio of light-emission is obtained and the orientation angle of the molecule can be obtained from a light-emission spectrum when the polarized light enters the molecule.

$$R = \frac{2[\sin^2\theta + \sin^2\alpha(3\cos^2\theta - 1)] - (3\sin^2\alpha - 1)(3\cos^2\theta - 1)\sin\gamma}{2\sin^2\theta + (2 - 3\sin^2\theta)\sin^2\gamma}$$ [Equation 1]

In the equation 1, R is a dichroic ratio, γ is an orientation angle, α is an incident angle, θ is an angle between a molecular aspect and a transient moment of the molecule.

Figure 6A:
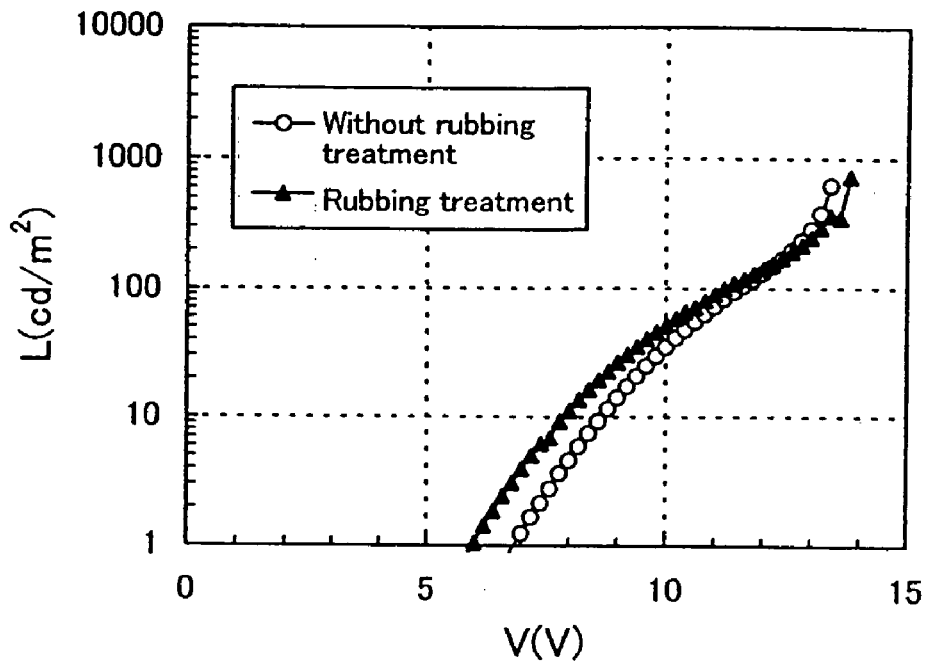
FIGS. 6A and 6B are a graph showing a measurement value of luminance to voltage and a graph showing a measurement value of current efficiency to luminance, respectively.
Figure 6B:
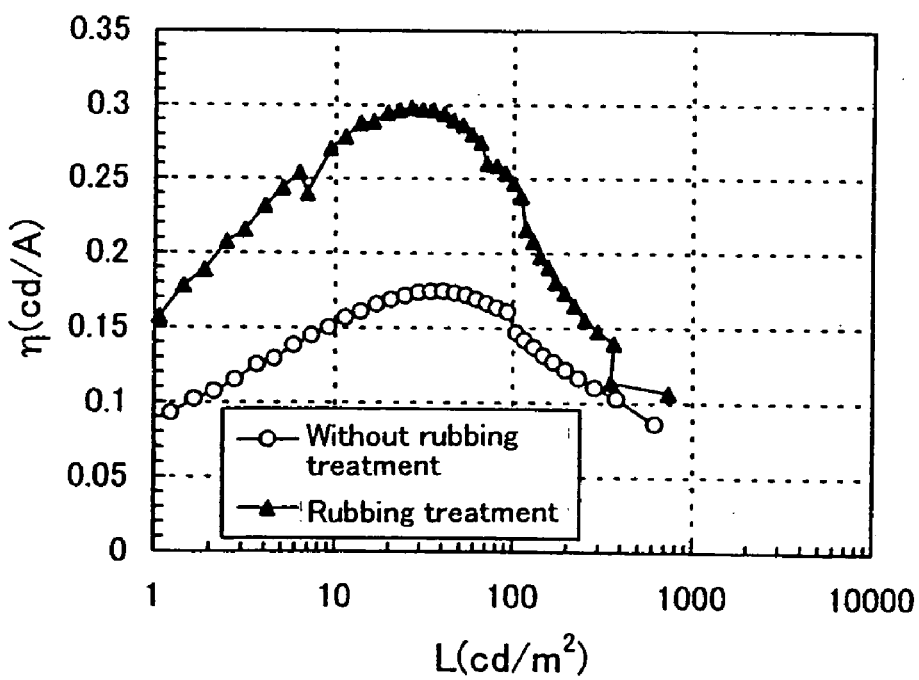

FIG. 6A shows a graph of measurement values of luminance L (cd/m²) to voltage V of the light-emitting element 3 with the rubbing treatment and the light-emitting element without the rubbing treatment. FIG. 6B shows a graph of measurement values of current efficiency ç (cd/A) to luminance L (cd/m²) of the light-emitting element 3 with the rubbing treatment and the light-emitting element without the rubbing treatment.

As shown in FIGS. 6A and 6B, the voltage for light-emission of lcd/m² is 6.0 V and the current efficiency is 0.24 cd/A in light-emission of 100 cd/m² in the light-emitting element 3 with the rubbing treatment. The photon numbers of P polarized light and S polarized light in the light-emission spectrum of $Alq_3$ are 6200 and 3000, respectively. The intensity ratio (dichroic ratio) of the P polarized light and the S polarized light is 2.067. The orientation angle of $Alq_3$ is 32.80 degrees from the dichroic ratio.

Note that the light-emission spectrum is measured by using a fluorescence spectrophotometer. The exciting light of 420 nm that $Alq_3$ absorbs is used. The exciting light is polarized to P polarized light (a light having a vibration direction in parallel with a plane of incidence) and S polarized light (a light having a vibration direction perpendicular to the plane of incidence) by setting a polarizing plate in front of an element in a real measurement, before the exciting light is emitted on the element, and then is incident. The incident angle of the exciting light with respect to an element face is fixed to 45°. The peak intensity ratio of the obtained light-emission spectrum is set as the dichroic ratio and thus an orientation angle is obtained.

On the other hand, as shown in FIGS. 6A and 6B, the voltage for light-emission of 1 cd/m² is 7.0 V and the current efficiency is 0.15 cd/A in light-emission of 100 cd/m² in the light-emitting element without the rubbing treatment.

Therefore, it is understood that the voltage for light-emission of 1 cd/m² is lower and the current efficiency in light-emission of 100 cd/m² is higher in the light-emitting element 3 with the rubbing treatment than in the light-emitting element without the rubbing treatment. The photon numbers of P polarized light and S polarized light in the light-emission spectrum of $Alq_3$ are 7800 and 3300, respectively. The intensity ratio (dichroic ratio) of the P polarized light and the S polarized light is 2.364. The orientation angle of $Alq_3$ is 29.84 degrees from the dichroic ratio.

When the values of the orientation angle of $Alq_3$ are compared with each other between the light emitting element with the rubbing treatment and the light emitting element without the rubbing treatment, it is understood that the light-emitting element with the rubbing treatment has a smaller angle between the transient moment of $Alq_3$ and the substrate plane, and the transient moment is decumbent (lying down) to the substrate in the light-emitting element with the rubbing treatment. In other words, it is thought that a direction of light-emission from $Alq_3$ can be perpendicular to the electrode face by the rubbing treatment.

[Embodiment 4]

Electronic devices using a light-emitting element of the present invention include a video camera, a digital camera, a goggle type display (head mounted display), a navigation system, an audio player (such as a car audio compo or an audio compo), a computer, a game machine, a portable information terminal (such as a mobile computer, a cellular telephone, a portable game machine or an electronic book), an image reproducing device provided with a recording medium (typically, a device provided with a display that can reproduce a recording medium such as DVD (digital versatile disc) and display the image) and the like. Practical examples thereof are shown in FIGS. 7A to 7H.

Figure 7A:
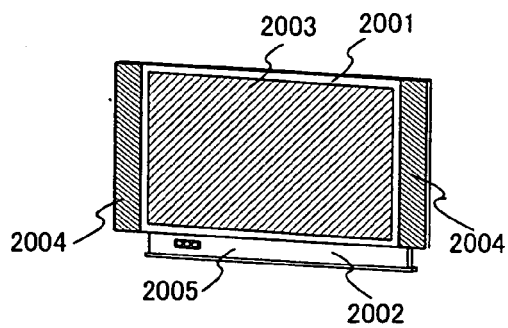
FIGS. 7A to 7H show electronic devices for which a light-emitting element of the present invention is used.

FIG. 7A shows a television receiver including a casing 2001, a support 2002, a display portion 2003, a speaker portion 2004, a video input terminal 2005 and the like. The television receiver can be manufactured by using a light-emitting element of the present invention for the display portion 2003 or the like.

Figure 7B:
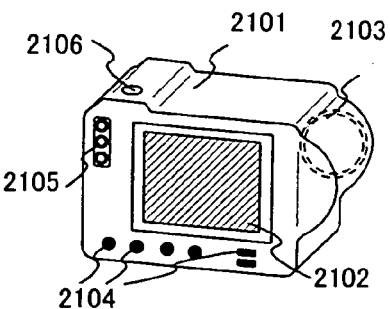

FIG. 7B shows a digital camera including a main body 2101, a display portion 2102, an image receiving portion 2103, operation keys 2104, an external connection port 2105, a shutter 2106 and the like. The digital camera can be manufactured by using a light-emitting element of the present invention for the display portion 2102 or the like.

Figure 7C:
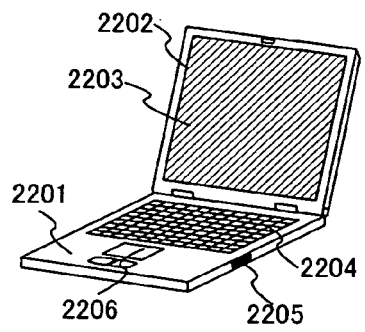

FIG. 7C shows a computer including a main body 2201, a casing 2202, a display portion 2203, a keyboard 2204, an external connection port 2205, a pointing mouse 2206 and the like. The computer can be manufactured by using a light-emitting element of the present invention for the display portion 2203 or the like.

Figure 7D:
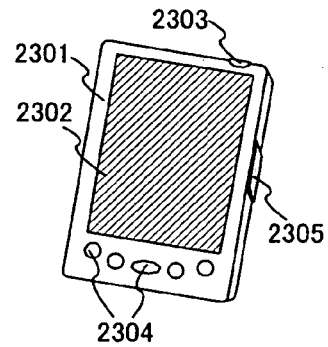

FIG. 7D shows a mobile computer including a main body 2301, a display portion 2302, a switch 2303, operation keys 2304, an infrared port 2305 and the like. The mobile computer can be manufactured by using a light-emitting element of the present invention for the display portion 2302 or the like.

Figure 7E:
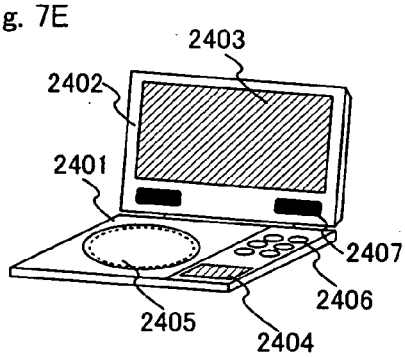

FIG. 7E shows a portable image reproducing device provided with a recording medium (such as a DVD player), which includes a main body 2401, a casing 2402, display portions A 2403 and B 2404, a read-in portion for a recording medium (such as DVD) 2405, operation keys 2406, a speaker portion 2407 and the like. The display portion A 2403 mainly displays image information and the display portion B 2404 mainly displays character information. The image reproducing device can be manufactured by using a light-emitting element of the present invention for the display portions A 2403 and B 2404 or the like. Note that the image reproducing device provided with a recording medium includes a game machine and the like.

Figure 7F:
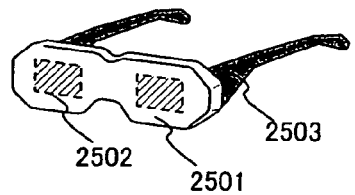

FIG. 7F shows a goggle type display (head mounted display) including a main body 2501, a display portion 2502, an arm portion 2503 and the like. The goggle type display can be manufactured by using a light-emitting element of the present invention for the display portion 2502 or the like.

Figure 7G:
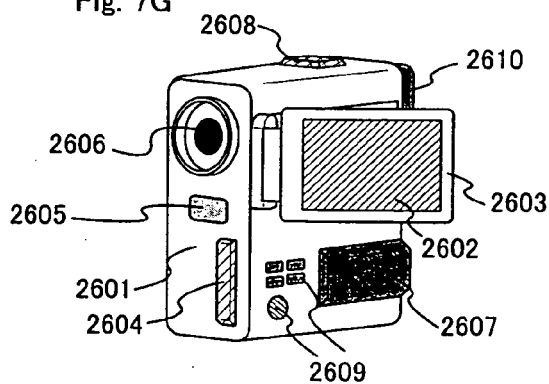

FIG. 7G shows a video camera including a main body 2601, a display portion 2602, a casing 2603, an external connection port 2604, a remote controller receiving portion 2605, an image receiving portion 2606, a battery 2607, a sound input portion 2608, operation keys 2609, an eye piece 2610 and the like. The video camera can be manufactured by using a light-emitting element of the present invention for the display portion 2602 or the like.

Figure 7H:
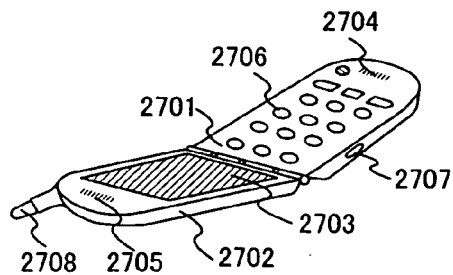

FIG. 7H shows a cellular telephone including a main body 2701, a casing 2702, a display portion 2703, a sound input portion 2704, a sound output portion 2705, operation keys 2706, an external connection port 2707, an antenna 2708 and the like. The cellular telephone can be manufactured by using a light-emitting element of the present invention for the display portion 2703 or the like.

Note that a light-emitting element of the present invention can be applied to a front type or a rear type projector as well as the above described electronic devices.

As described above, the present invention can be applied extremely widely and used for electronic devices of all fields. This application is based on Japanese Patent Application serial no. 2003-305915 filed in Japan Patent Office on 29th, Aug., 2003, the contents of which are hereby incorporated by reference.

Although the present invention has been fully described by way of Embodiment Mode and Embodiments with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. A method for manufacturing a light-emitting element, comprising:

forming a first electrode;

performing a rubbing treatment on surface of the first electrode;

forming a light emitting layer including an organic compound over the first electrode after the step of performing the rubbing treatment; and forming a second electrode over the light emitting layer.

2. A method for manufacturing a light-emitting element according to claim 1, wherein the first electrode comprises a metal oxide.

3. A method for manufacturing a light-emitting element according to claim 1, wherein the first electrode comprises an ITO.

4. A method for manufacturing a light-emitting element according to claim 1, wherein a dichroic ratio of polarized light PL intensity in the light emitting layer is changed by ten percents or more by the rubbing treatment.

5. A method for manufacturing a light-emitting element according to claim 1, wherein an orientation angle of the organic compound included in the light emitting layer is changed in a range of from 2° through 90° by the rubbing treatment.

6. A method for manufacturing a light-emitting element according to claim 1, wherein the rubbing treatment is performed by rubbing a surface of the first electrode with a rubbing cloth.

7. A method for manufacturing a light-emitting element according to claim 6, wherein cellulosic fiber is used as the rubbing cloth.

8. A method for manufacturing a light-emitting element according to claim 1, wherein the rubbing treatment is performed by rotating a roller wrapped with a rubbing cloth in one direction.

9. A method for manufacturing a light-emitting element, comprising:

forming a first electrode containing a crystal component;

performing a rubbing treatment on surface of the first electrode;

forming a light emitting layer including an organic compound over the first electrode after the step of performing the rubbing treatment; and forming a second electrode over the light emitting layer.

10. A method for manufacturing a light-emitting element according to claim 9, wherein the first electrode comprises a metal oxide.

11. A method for manufacturing a light-emitting element according to claim 9, wherein the first electrode comprises an ITO.

12. A method for manufacturing a light-emitting element according to claim 9, wherein a dichroic ratio of polarized light PL intensity in the light emitting layer is changed by ten percents or more by the rubbing treatment.

13. A method for manufacturing a light-emitting element according to claim 9, wherein an orientation angle of the organic compound included in the light emitting layer is changed in a range of from 20° through 90° by the rubbing treatment.

14. A method for manufacturing a light-emitting element according to claim 9, wherein the rubbing treatment is performed by rubbing a surface of the first electrode with a rubbing cloth.

15. A method for manufacturing a light-emitting element according to claim 14, wherein cellulosic fiber is used as the rubbing cloth.

16. A method for manufacturing a light-emitting element according to claim 9, wherein the rubbing treatment is performed by rotating a roller wrapped with a rubbing cloth in one direction.

17. A method for manufacturing a light-emitting element, comprising:
   forming a first electrode;
   enhancing a crystallinity of the firs electrode by performing a heat treatment thereon;
   performing a rubbing treatment on a surface of the first electrode;
   forming a light emitting layer including organic compound over the first electrode after the step of performing the rubbing treatment; and
   forming a second electrode over the light emitting layer.

18. A method for manufacturing a light-emitting element according to claim 17, wherein the first electrode comprises a metal oxide.

19. A method for manufacturing a light-emitting element according to claim 17, wherein the first electrode comprises an ITO.

20. A method for manufacturing a light-emitting element according to claim 17, wherein a dichroic ratio of polarized light PL intensity in the light emitting layer is changed by ten percents or more by the rubbing treatment.

21. A method for manufacturing a light-emitting element according to claim 17, wherein an orientation angle of the organic compound included in the light emitting layer is changed in a range of from 20° through 90° by the rubbing treatment.

22. A method for manufacturing a light-emitting element according to claim 17, wherein the rubbing treatment is performed by rubbing a surface of the first electrode with a rubbing cloth.

23. A method for manufacturing a light-emitting element according to claim 22, wherein cellulosic fiber is used as the rubbing cloth.

24. A method for manufacturing a light-emitting element according to claim 17, wherein the rubbing treatment is performed by rotating a roller wrapped with a rubbing cloth in one direction.

25. A method for manufacturing a light-emitting element, comprising:
   forming a conductive film containing a crystal component;
   performing a rubbing treatment on a surface of the conductive film;
   patterning the conductive film to form a first electrode after the step of performing the rubbing treatment;
   forming a light emitting layer including an organic compound over the first electrode after the step of patterning the conductive film; and
   forming a second electrode over the light emitting layer.

26. A method for manufacturing a light-emitting element according to claim 25, wherein the first electrode comprises a metal oxide.

27. A method for manufacturing a light-emitting element according to claim 25, wherein the first electrode comprises an ITO.

28. A method for manufacturing a light-emitting element according to claim 25, wherein a dichroic ratio of polarized light PL intensity in the light emitting layer is changed by ten percents or more by the rubbing treatment.

29. A method for manufacturing a light-emitting element according to claim 25, wherein an orientation angle of the organic compound included in the light emitting layer is changed in a range of from 20° through 90° by the rubbing treatment.

30. A method for manufacturing a light-emitting element according to claim 25, wherein the rubbing treatment is performed by rubbing a surface of the conductive film with a rubbing cloth.

31. A method for manufacturing a light-emitting element according to claim 30, wherein cellulosic fiber is used as the rubbing cloth.

32. A method for manufacturing a light-emitting element according to claim 25, wherein the rubbing treatment is performed by rotating a roller wrapped with a rubbing cloth in one direction.

33. A method for manufacturing a light-emitting element, comprising:
   forming a conductive film;
   enhancing a crystallinity of the conductive film by performing a heat treatment thereon;
   performing a rubbing treatment on surface of the conductive film;
   patterning the conductive film to form a first electrode after the step of performing the rubbing treatment;
   forming a light emitting layer including an organic compound over the first electrode after the step of patterning the conductive film; and
   forming a second electrode over the light emitting layer.

34. A method for manufacturing a light-emitting element according to claim 33, wherein the first electrode comprises a metal oxide.

35. A method for manufacturing a light-emitting element according to claim 33, wherein the first electrode comprises an ITO.

36. A method for manufacturing a light-emitting element according to claim 33, wherein a dichroic ratio of polarized light PL intensity in the light emitting layer is changed by ten percents or more by the rubbing treatment.

37. A method for manufacturing a light-emitting element according to claim 33, wherein an orientation angle of the organic compound included in the light emitting layer is changed in a range of from 2° through 90° by the rubbing treatment.

38. A method for manufacturing a light-emitting element according to claim 33, wherein the rubbing treatment is performed by rubbing a surface of the conductive film with a rubbing cloth.

39. A method for manufacturing a light-emitting element according to claim 38, wherein cellulosic fiber is used as the rubbing cloth.

40. A method for manufacturing a light-emitting element according to claim 33, wherein the rubbing treatment is performed by rotating a roller wrapped with a rubbing cloth in one direction.

41. A method for manufacturing a light-emitting element comprising:
   forming a first electrode over a substrate;
   forming a minute unevenness on a surface of the first electrode;
   forming a light emitting layer including an organic compound over the first electrode after the step of forming the minute unevenness; and
   forming a second electrode over the light emitting layer.

42. A method for manufacturing a light-emitting element according to claim 41, wherein the first electrode comprises a metal oxide.

43. A method for manufacturing a light-emitting element according to claim 41, wherein the first electrode comprises an ITO.

44. A method for manufacturing a light-emitting element according to claim 41, wherein a dichroic ratio of polarized light PL intensity in the light emitting layer is changed by ten percents or more by the formation of the minute unevenness on the surface of the electrode.

45. A method for manufacturing a light-emitting element according to claim 41, wherein an orientation angle of the organic compound included in the light emitting layer is changed in a range of from 20° through 90° by the formation of the minute unevenness on the surface of the electrode.

46. A method for manufacturing a light-emitting element according to claim 41, wherein the unevenness formation is performed by rubbing a surface of the first electrode with a rubbing cloth.

47. A method for manufacturing a light-emitting element according to claim 46, wherein cellulosic fiber is used as the rubbing cloth.

48. A method for manufacturing a light-emitting element according to claim 41, wherein the unevenness formation is performed by rotating a roller wrapped with a rubbing cloth in one direction.

* * * * *